US006534372B1

(12) United States Patent
Racanelli

(10) Patent No.: US 6,534,372 B1
(45) Date of Patent: Mar. 18, 2003

(54) METHOD FOR FABRICATING A SELF-ALIGNED EMITTER IN A BIPOLAR TRANSISTOR

(75) Inventor: Marco Racanelli, Orange, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/721,344

(22) Filed: Nov. 22, 2000

(51) Int. Cl.⁷ .................... H01L 21/331; H01L 21/8249

(52) U.S. Cl. ........................ 438/321; 438/235

(58) Field of Search ................................ 438/321, 309, 438/235, 314, 315, 318, 320, 323, 350, 359, 361, 364, 365; 257/552, 553, 559, 564, 571, 29.03, 29.031, 29.033, 29.034

(56) References Cited

U.S. PATENT DOCUMENTS

| 4,927,774 A | * | 5/1990 | Welbourn et al. ..... 148/DIG. 10 |
| 5,064,774 A | * | 11/1991 | Pfiester ................ 148/DIG. 10 |
| 5,516,708 A | * | 5/1996 | Li et al. ............... 148/DIG. 10 |
| 5,581,114 A | * | 12/1996 | Bashir et al. ................ 257/588 |
| 5,583,348 A | * | 12/1996 | Sundaram .................... 257/477 |
| 5,668,022 A | * | 9/1997 | Cho et al. ............. 148/DIG. 72 |
| 5,821,149 A | | 10/1998 | Schuppen et al. |
| 5,856,225 A | * | 1/1999 | Lee et al. .................... 438/291 |
| 6,177,303 B1 | * | 1/2001 | Schmitz et al. .............. 438/194 |
| 6,225,173 B1 | * | 5/2001 | Yu ............................. 438/183 |
| 6,300,201 B1 | * | 10/2001 | Shao et al. .................. 438/281 |

FOREIGN PATENT DOCUMENTS

EP           795899 A1 *  9/1997  .......... H01L/21/331

* cited by examiner

Primary Examiner—Olik Chaudhuri
Assistant Examiner—Brook Kebede
(74) Attorney, Agent, or Firm—Farjami & Farjami LLP

(57) ABSTRACT

In one disclosed embodiment, a silicon-germanium base is formed, which includes an extrinsic base region, a link base region, and an intrinsic base region. An etch stop layer, which can be silicon oxide, is deposited over the silicon-germanium base. A polycrystalline silicon layer is then formed on the etch stop layer above the silicon-germanium base. The polycrystalline silicon layer is patterned to form a temporary emitter. The link base regions can be implant doped after fabricating the temporary emitter, for example, to reduce the resistance of the link base regions. Link spacers are then fabricated on the sides of the temporary emitter. The link spacers can be formed by depositing a conformal layer of silicon oxide over the temporary emitter and then etching back the conformal layer. The length of the link base regions, which are below the spacers, can be determined by the deposition thickness of the conformal layer. The extrinsic base regions are implant doped after fabricating the link spacers. A protective layer of silicon oxide can be deposited over the extrinsic base regions, link spacers and temporary emitter prior to patterning the temporary emitter and link spacers by opening a photoresist mask. The temporary emitter is then etched away and the etch stop layer is removed, forming a cavity between the link spacers. A final emitter is then formed in the cavity. For example, the final emitter can be formed by depositing polycrystalline silicon in the cavity and forming a base-emitter junction within the intrinsic base region.

41 Claims, 7 Drawing Sheets

METHOD FOR FABRICATING A SELF-ALIGNED EMITTER IN A BIPOLAR TRANSISTOR

BACKGROUND OF THE INVENTION

1. Field of the Invention

The present invention relates to the field of fabrication of semiconductor devices. More specifically, the invention relates to the fabrication of silicon-germanium semiconductor devices.

2. Background Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 Ghz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. Silicon-germanium may be epitaxially grown, however, on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

Because the benefits of a high gain and high speed silicon-germanium HBT device can be either partially or completely negated by high base and emitter contact resistance, it is important that the resistance of the base and emitter contacts be kept low. In addition to the contact resistances, the geometry of the base and emitter regions may also affect the base and emitter resistance. For example, contact to the emitter has previously been made in a manner known in the art by designing an emitter which is "routed out" and whose width is increased to provide a satisfactory area in which to form an emitter contact. The geometry of the base region may necessitate providing a low resistance electrical pathway through a portion of the base itself between the base contact and the base-emitter junction. In order to provide lower resistance from the base contact to the base-emitter junction, the extrinsic base region is heavily doped by implantation (also called extrinsic doping). The heavily doped extrinsic base region has a reduced resistance.

The region in the base between the edge of the heavily doped extrinsic base region and the edge of the base-emitter junction is referred to as the link base region. The link base region adds a significant amount of resistance between the base contact and the base-emitter junction. It is, therefore, important for the reasons stated above that resistance of the link base region also be kept low. The resistance of the link base region is affected by the length of the link base region from the heavily doped extrinsic base region to the edge of the base-emitter junction. Since the base-emitter junction is substantially coterminous with an "intrinsic base region," the link base region spans a distance between the intrinsic base region and the extrinsic base region. In other words, the link base region "links" the extrinsic base region to the intrinsic base region.

The length of the link base region spanning from the heavily doped extrinsic base region to the intrinsic base region must be no smaller than a certain minimum separation distance in order to provide separation between the heavily doped region of the extrinsic base and the heavily doped region of the emitter near the base-emitter junction. The link base region itself is relatively lightly doped. If the separation between the heavily doped region of the extrinsic base and the heavily doped region of the emitter near the base-emitter junction is not greater than a minimum separation distance, the two heavily doped regions can form a high electric field junction and increase the leakage current between the emitter and the base, thereby degrading the performance characteristics of the HBT device.

Depending on the alignment of the sequence of steps in the fabrication process used to form the link base region, the intrinsic base region, the base-emitter junction, and to implant the heavily doped extrinsic base region, the distance across the link base region to the intrinsic base region can vary, often unpredictably. The distance across the link base region to the intrinsic base region is also referred to as the length of the link base region in the present application.

With perfect alignment of the sequence of steps in the fabrication process, the distance across the link base region can be minimized to the minimum separation distance just discussed. In that case, the link base resistance would also be minimized. In a fabrication process which uses two separate photomasks, for example, to form the link base region, the intrinsic base region, the base-emitter junction, and to implant the heavily doped extrinsic base region, there is always a margin of error in the alignment of the two photomask steps. Accounting for the misalignment of the two photomask steps in the fabrication process forces the fabrication of a much greater distance across the link base region than the minimum separation distance. Thus, the link base resistance is greater than the minimum possible link base resistance.

Other fabrication processes and tools have been tried in attempts to solve the problem of aligning the link base and extrinsic base to the emitter in silicon-germanium devices. One approach requires the use of selective epitaxy along with use of an inside spacer. Selective epitaxy presents a problem in that it is not currently used in high volume production of semiconductor devices. Selective epitaxy presents another problem in that selective epitaxial deposition occurs only on silicon regions and not on oxide regions. Since most process monitoring is done on oxide regions, selective epitaxy results in a substantial loss of process monitoring capability. Use of an inside spacer presents a further problem in that variability of emitter width is greater than with other methods, so some accuracy in control of emitter width is lost.

It is important to provide low resistances in the base and emitter contacts, the heavily doped extrinsic base region, and the link base region in order to improve the performance and operating characteristics of the HBT or other similar device such as a conventional bipolar transistor. Because the resistances of the base contact, the heavily doped extrinsic base region, and the link base region are in series, the reduction of any one of them will provide an improvement in the resistance of the conduction path from the base contact to the intrinsic base region of the HBT or base of other similar device. In addition, as feature sizes of bipolar devices are reduced, it is important to achieve accurate control over the size of certain features, such as the emitter width of the HBT. Furthermore, as feature size of CMOS devices is reduced it is important to achieve a concomitant reduction of feature size in bipolar devices on the same chip as CMOS devices.

Thus, there is need in the art to reduce the link base resistance by providing a fabrication process which does not rely on the alignment of separate photomasks to form the link base region, the intrinsic base region, the base-emitter junction, and to implant the heavily doped extrinsic base region. There is also need in the art for fabrication of a low link base resistance structure which achieves accurate control over the emitter width. There is a further need in the art for a fabrication process for bipolar devices which is scalable to the size of MOS and CMOS devices.

SUMMARY OF THE INVENTION

The present invention is directed to a method for fabricating a self-aligned emitter in a bipolar transistor. The invention overcomes need in the art for fabrication of a low link base resistance structure which achieves accurate control over the emitter width. The invention reduces the link base resistance of a bipolar transistor by providing a fabrication process which does not rely on the alignment of separate photomasks to form the link base region, the intrinsic base region, the base-emitter junction, and to implant the heavily doped extrinsic base region. The invention also provides a fabrication process for bipolar devices which is scalable to the size of MOS and CMOS devices.

According to the invention a silicon-germanium base is formed, which includes an extrinsic base region, a link base region, and an intrinsic base region. An etch stop layer, which for example can be silicon oxide, is deposited over the silicon-germanium base. A layer of polycrystalline silicon is then formed on the etch stop layer above the silicon-germanium base. The polycrystalline silicon layer is patterned to form a temporary emitter. The link base regions can be implant doped after fabricating the temporary emitter, for example, to reduce the resistance of the link base regions, i.e. the emitter and link base regions are self-aligned.

Link spacers are then fabricated on the sides of the temporary emitter. The link spacers can be formed, for example, by depositing a conformal layer of silicon oxide over the temporary emitter and then etching back the conformal layer. The length of the link base regions, which are below the spacers, can be determined by the deposition thickness of the conformal layer. The extrinsic base regions are implant doped after fabricating the link spacers, i.e. the emitter and extrinsic base regions are self-aligned.

The temporary emitter is then etched away and the etch stop layer is removed, forming a cavity between the link spacers. For example, a protective layer of silicon oxide can be deposited over the extrinsic base regions, link spacers and temporary emitter prior to patterning the temporary emitter and link spacers by opening a photoresist mask. A final emitter is then formed in the cavity. For example, the final emitter can be formed by depositing polycrystalline silicon in the cavity and forming an base-emitter junction within the intrinsic base region.

DETAILED DESCRIPTION OF THE INVENTION

The present invention is directed to method for fabricating a self-aligned emitter in a bipolar transistor. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
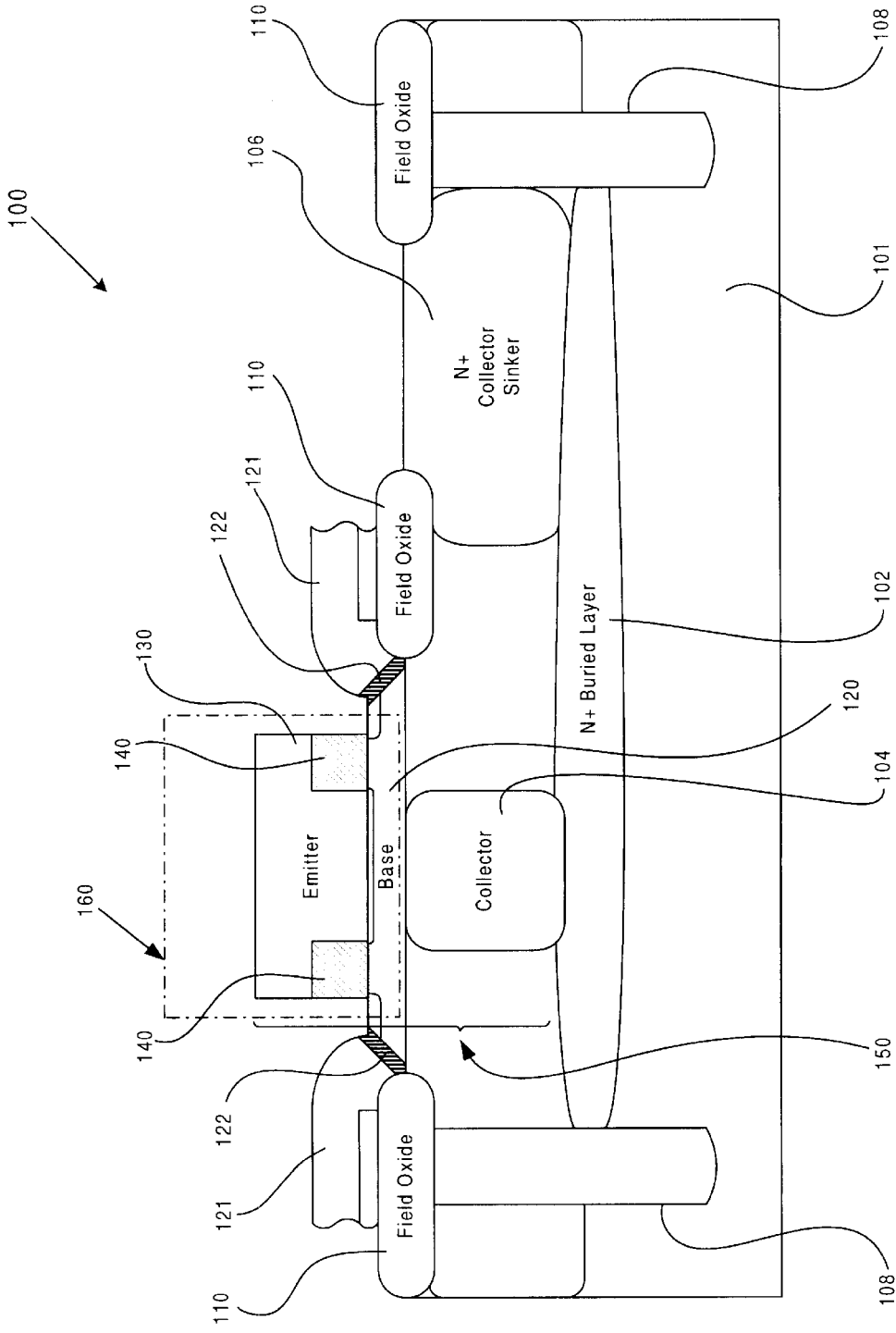
FIG. 1 illustrates a cross sectional view of some of the features of an NPN HBT.

By way of background, FIG. 1 shows a cross sectional view of various features and components of structure 100 which includes various features and components of an NPN heterojunction bipolar transistor ("HBT"). Structure 100 includes collector 104, base 120, and emitter 130. Collector 104 is N-type single crystal silicon which can be deposited epitaxially using an RPCVD process in a manner known in the art. Base 120 is P-type silicon-germanium single crystal deposited epitaxially in a "nonselective" RPCVD process according to one embodiment of the invention. As seen in FIG. 1, base 120 is situated on top of, and forms a junction with, collector 104. Base contacts 121 are polycrystalline silicon-germanium deposited epitaxially in a "nonselective" RPCVD process according to one embodiment of the invention. Base 120 and base contacts 121 connect with each other at interfaces 122 between the contact polycrystalline material and the base single crystal material. Emitter 130, which is situated above and forms a junction with base 120, is comprised of N-type polycrystalline silicon. Collector 104, base 120, and emitter 130 thus form a heterojunction bipolar transistor ("HBT") which is generally referred to by numeral 150 in FIG. 1.

As seen in FIG. 1, buried layer 102, which is composed of N+ type material—meaning that it is relatively heavily doped N-type material—is formed in silicon substrate 101 in a manner known in the art. Collector sinker 106, also composed of N+ type material, is formed by diffusion of heavily concentrated dopants from the surface of collector sinker 106 down to buried layer 102. Buried layer 102, along with collector sinker 106, provide a low resistance electrical pathway from collector 104 through buried layer 102 and collector sinker 106 to a collector contact (the collector contact is not shown in any of the Figures). Deep trench 108 and field oxide 110 isolation structures composed of silicon oxide ($SiO_2$) material are formed in a manner known in the art. Deep trench 108 and field oxide 110 isolation structures provide electrical isolation from other devices on silicon substrate 101 in a manner known in the art. Dielectric segments 140, which can be composed of silicon oxide, provide electrical isolation to emitter 130 from base 120. The region enclosed by dashed line 160 corresponds to structure 260 of FIG. 2, which shows the area enclosed by dashed line 160 in greater detail.

Figure 2:
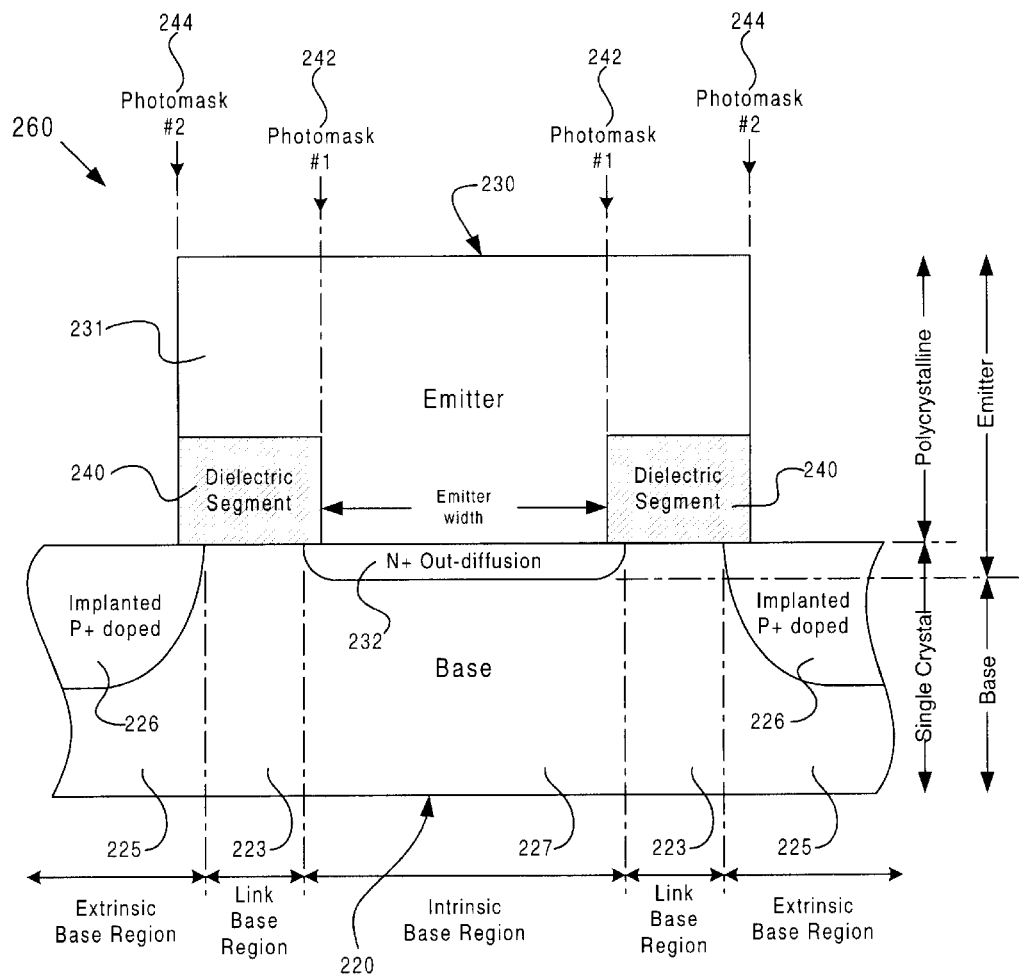
FIG. 2 illustrates in greater detail a portion of the cross sectional view of FIG. 1, and shows a cross sectional view of some of the features of an NPN HBT.

FIG. 2 shows a more detailed cross sectional view of selected features and components of structure 100 of FIG. 1. In particular, portions of emitter 130, base 120, and dielectric segments 140 enclosed by dashed line 160 in FIG. 1 are shown respectively as emitter 230, base 220, and dielectric segments 240 in structure 260 in FIG. 2. As FIG. 2 shows, emitter 230 comprises emitter polycrystalline silicon 231 and "out-diffusion region" 232 formed by the out-diffusion of N+ dopants from the emitter polycrystalline silicon 231 into the single crystal layer therebelow. As seen in FIG. 2, emitter polycrystalline silicon 231 is situated above N+ out-diffusion region 232.

Also as seen in FIG. 2, emitter polycrystalline silicon 231 substantially encapsulates dielectric segments 240. Dielectric segments 240 are situated above single crystal link base regions 223. In one embodiment, dielectric segments 240 can be silicon oxide. Single crystal N+ out-diffusion region 232 is situated above single crystal intrinsic base region 227. Extrinsic base regions 225, link base regions 223, and intrinsic base region 227 comprise base 220. The base-emitter junction is formed within the single crystal layer at the boundary of N+ out-diffusion area 232 and intrinsic base region 227.

Continuing with FIG. 2, N+ out-diffusion region 232 in the single crystal layer is formed by out-diffusion of heavy concentration of arsenic dopants after ion implantation doping of emitter polycrystalline silicon 231. The N+ doping renders emitter 230 an N-type emitter. Ion implantation of extrinsic base regions 225 has resulted in the heavily doped P+ implanted regions 226 within extrinsic base regions 225. In one embodiment, the dopant used to form implanted regions 226 can be boron. The heavy doping in implanted regions 226 lowers the overall resistance of extrinsic base regions 225. The overall base resistance of HBT 150 is thereby improved by lowering the contribution of extrinsic base regions 225 to the series resistance of the path from the base contacts, through the heavily doped extrinsic base regions 225, and link base regions 223 to intrinsic base region 227.

Continuing with FIG. 2, the distance between the two dielectric segments 240, which is also the emitter width, is determined by a first photomask. This first photomask is called "photomask #1" in FIG. 2 and is referred to by numeral 242. The boundaries of extrinsic base regions 225 are determined by a subsequent photomask which must be aligned with the first photomask. This subsequent photomask is called "photomask #2" in FIG. 2 and is referred to by numeral 244. Misalignment of the two photomasks causes the dimensions of dielectric segments 240 and the distance across link base region 223 to vary in an unpredictable fashion. Because the misalignment is unpredictable, the distance across link base region 223 must be increased to account for the misalignment. Thus, link base resistance, which depends on the distance across link base region 223, is not minimized in the two-photomask process discussed above.

FIGS. 3, 4, 6, and 7 illustrate detailed cross sectional views of some of the features of an NPN HBT fabricated in accordance with one embodiment of the present invention as described below. FIG. 5 illustrates a detailed cross sectional view of some of the features of an NPN HBT fabricated in accordance with an alternative embodiment of the present invention as described below. Each of FIGS. 3, 4, 6, and 7 shows the resulting structure at a selected step in a sequence of steps used to fabricate an NPN HBT in accordance with one embodiment. FIG. 5 shows the resulting structure at a step which corresponds to the same step in the sequence of processing as FIG. 4, but in a process used to form an NPN HBT in accordance with an alternative embodiment. Certain details and intermediate steps have been left out which are apparent to a person of ordinary skill in the art.

Figure 3:
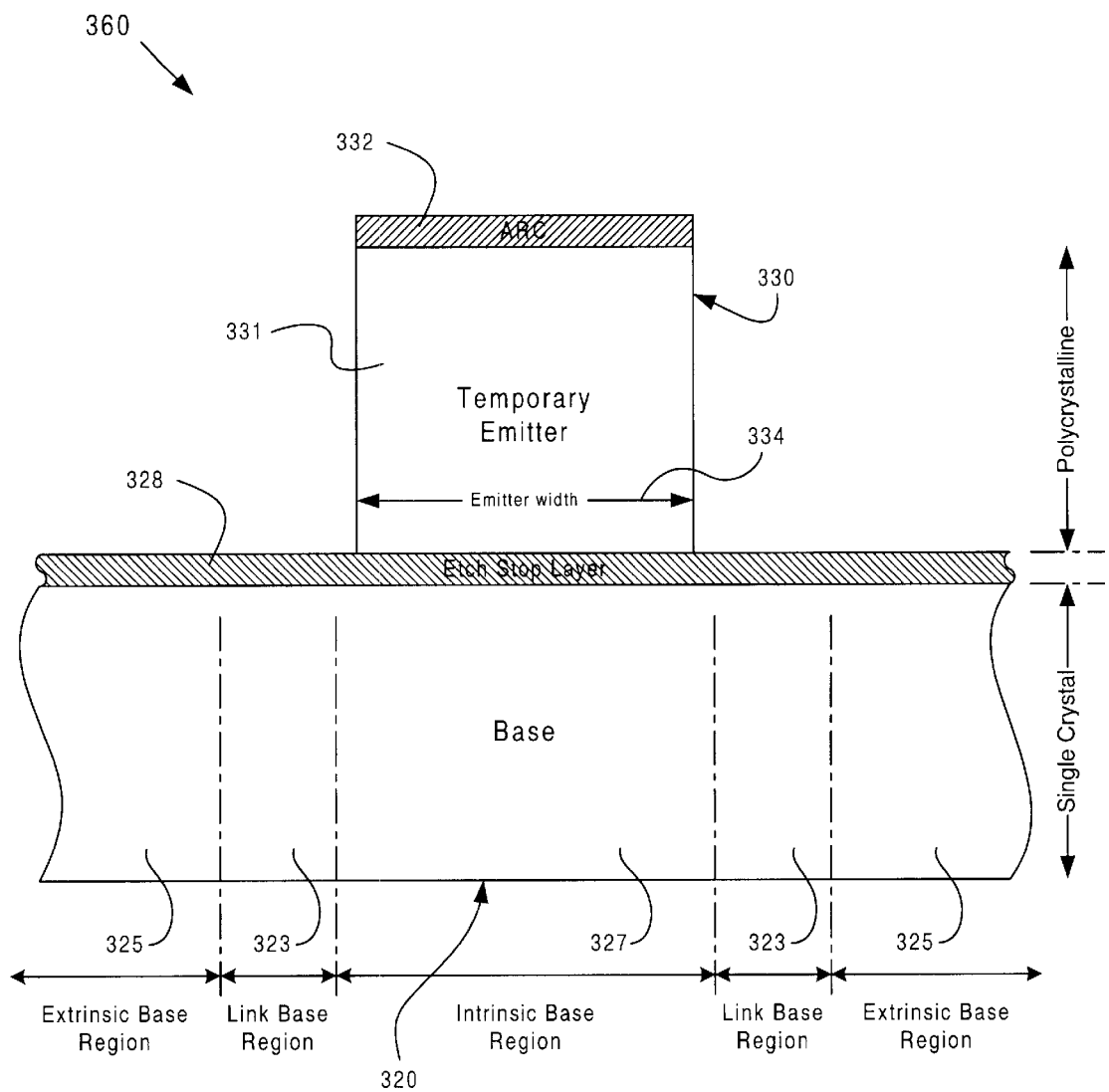
FIG. 3 illustrates a cross sectional view, at a level of detail similar to that of FIG. 2, of some of the features, including a temporary emitter, of an NPN HBT fabricated in accordance with one embodiment of the present invention.

FIG. 3 shows structure 360 comprising a region of an NPN HBT fabricated in accordance with one embodiment that corresponds to the region of the NPN HBT enclosed by dashed line 160 of FIG. 1. Structure 360 includes features and components which are analogous in form and function to corresponding features and components of structure 100 in FIG. 1. The corresponding features and components are numbered in a manner consistent with FIG. 1. In particular, portions of selected features and components of structure 100 of FIG. 1 corresponding to base 120 enclosed by dashed line 160 in FIG. 1 are shown as base 320 in structure 360 in FIG. 3. As FIG. 3 shows, extrinsic base regions 325, link base regions 323, and intrinsic base region 327 comprise base 320.

FIG. 3 also shows temporary emitter 330, which is analogous in form and position, but not in function, to emitter 130 of FIG. 1. Temporary emitter 330 comprises temporary emitter polycrystalline silicon 331, anti-reflective coating ("ARC") 332, and the portion of etch stop layer 328 directly below emitter polycrystalline silicon 331. According to one embodiment, temporary emitter polycrystalline silicon 331 is deposited over the general area of structure 360 and then patterned by using a photomask. Although polycrystalline silicon is used in one embodiment of the invention described here, it is manifest that any layer of material that is suitable for accurate patterning using a photomask or other patterning techniques can be used. The suitable material forms a temporary layer of material which is etched away at a later step in the process. To provide greater control and to achieve the smallest possible emitter width 334, ARC 332 can be deposited over temporary emitter polycrystalline silicon 331 before patterning temporary emitter polycrystalline silicon 331 with photoresist. For example, ARC 332 may be composed of silicon oxynitride. As seen below, emitter width 334 determines the width of the final emitter of the NPN HBT formed as the result of the sequence of steps according to one embodiment of the present invention. Emitter width 334 for an NPN HBT is typically in the range of approximately 0.2 to 0.9 microns. Etch stop layer 328 prevents damage to underlying silicon-germanium base 320 during the etching used to form temporary emitter 330. Etch stop layer 328 may be comprised, for example, of silicon oxide. Further more, although one embodiment of the present invention is described as forming temporary emitter 330 on silicon-germanium base 320, temporary emitter 330 can be formed, for example, on a base comprising silicon, or other types of base, in order to practice the present invention. The process used to form temporary emitter 330 follows the same steps used to form a gate for an MOS transistor, thus formation of temporary emitter 330, and the resulting final emitter, can be scaled (i.e., is "scalable") to match the feature size of CMOS devices on the same chip as the NPN HBT.

Continuing with FIG. 3, link base regions 323 may be lightly doped by ion implantation to reduce or control the resistance of link base regions 323. The ion implantation doping can be performed through etch stop layer 328. The ion implantation doping uses temporary emitter 330 as a mask. It is noted that doping of link base regions 323 is, thus, self-aligned; that is, the doping of link base regions 323 is defined by the edge of temporary emitter 330, and does not depend on the alignment of a photomask. The result of implant doping link base regions 323 is further described below in relation to FIG. 5. The description of the process used to form an NPN HBT in accordance with one embodiment continues with FIG. 4 on the premise that implanting of link base regions 323 has not been performed. However, the subsequent steps can be identical with either alternative of implanting link base regions 323 or not implanting link base regions 323.

Figure 4:
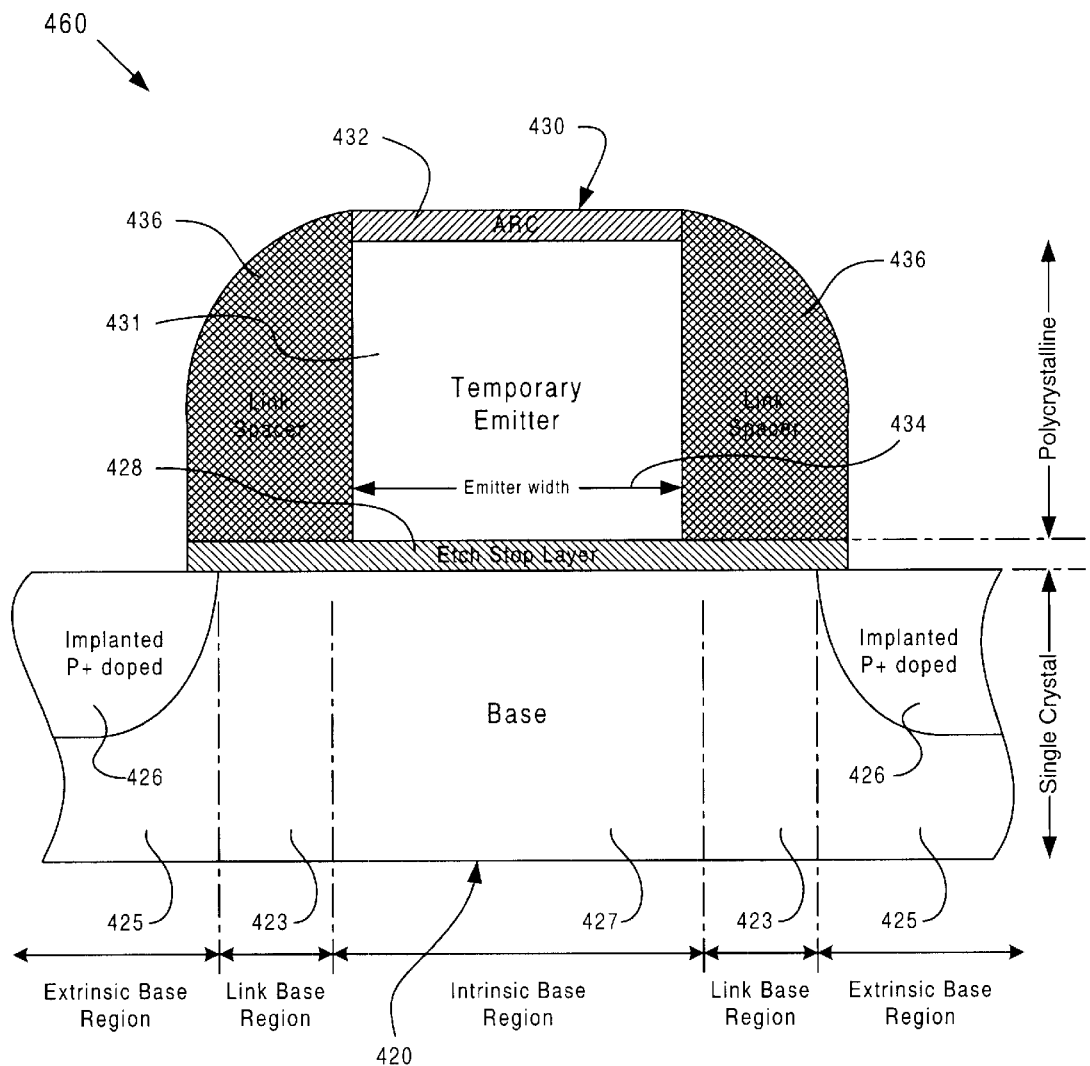
FIG. 4 illustrates the cross sectional view in FIG. 3, at a later time, of some of the features of an NPN HBT fabricated in accordance with one embodiment of the present invention.
Figure 5:
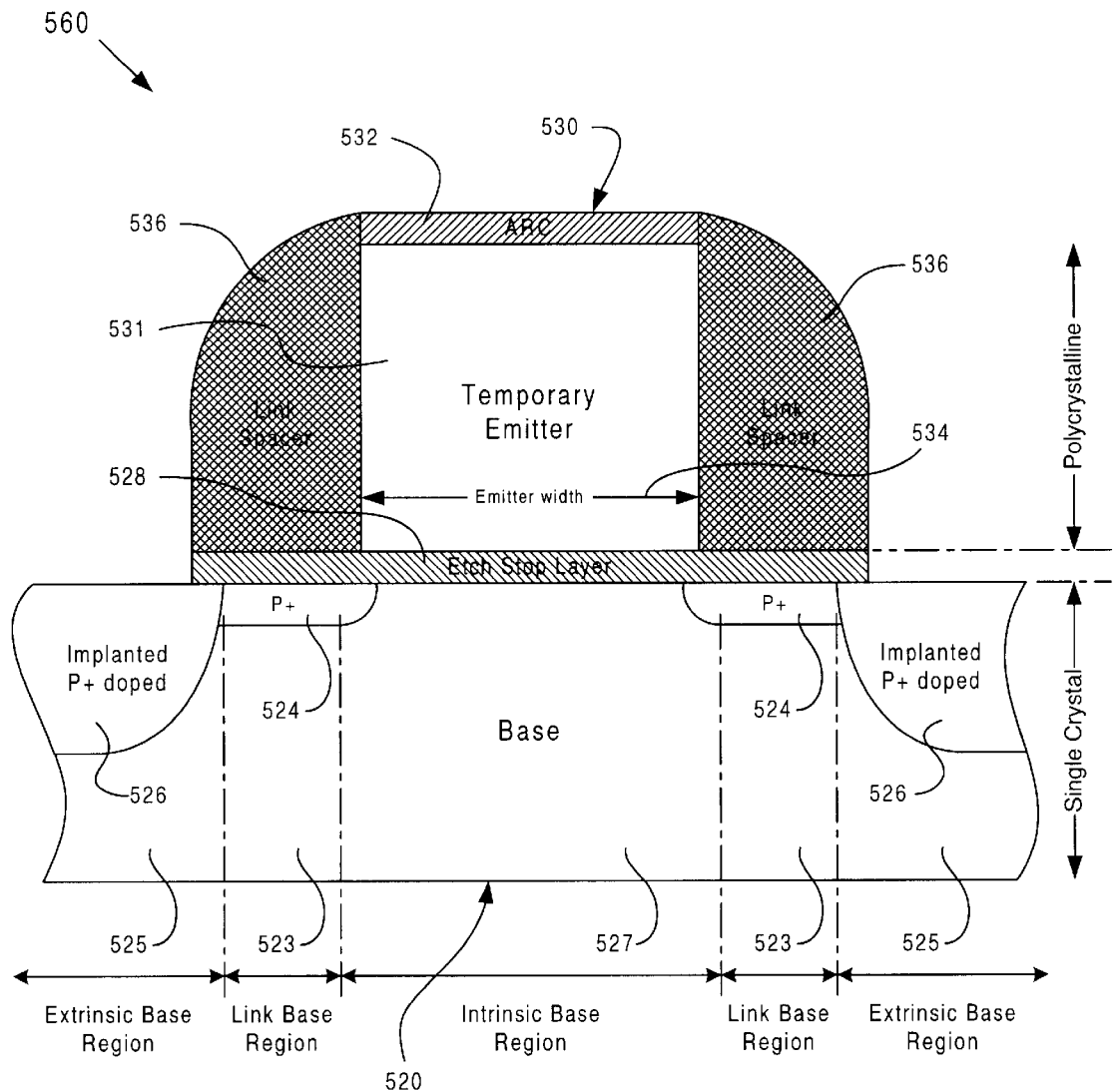
FIG. 5 illustrates the cross sectional view of FIG. 4 with some alternative features of an NPN HBT fabricated in accordance with another embodiment of the present invention.

Referring now to FIG. 4, the cross sectional view in FIG. 3 is shown after further steps in the process used to form an NPN HBT in accordance with one embodiment. Structure 460 of FIG. 4 shows various features and components of structure 360 of FIG. 3. Features and components of structure 460 corresponding to, those of structure 360 are numbered in a manner consistent with FIG. 3. In particular, base 320, link base regions 323, extrinsic base regions 325, intrinsic base region 327, temporary emitter 330, temporary emitter polycrystalline silicon 331, ARC 332, and emitter width 334 are shown, respectively, as base 420, link base regions 423, extrinsic base regions 425, intrinsic base region 427, temporary emitter 430, temporary emitter polycrystalline silicon 431, ARC 432, and emitter width 434. Note that a portion of etch stop layer 328 still remains as etch stop layer 428, which may be comprised of silicon oxide, comprising parts of temporary emitter 430 and link spacers 436. Also, ARC 432 still remains comprising part of temporary emitter 430. ARC 432 could be removed, if desired, before further processing, but removal of ARC 432 is not necessary.

Continuing with FIG. 4, a conformal layer of a dielectric, such as silicon oxide, is deposited as a blanket layer over the entire structure. For example, silicon oxide can be deposited at low temperature and pressure using a plasma-enhanced chemical vapor deposition ("PECVD") process. Then an "etch back" is used to etch away all silicon oxide, including both the conformal layer and portions of etch stop layer 428 outside of temporary emitter 430, except the areas adjacent to the two sides of temporary emitter 430. These unetched areas are link spacers 436 shown in FIG. 4. Link spacers 436 also include portions of etch stop layer 428. The edge position of link spacers 436, which also determines the boundaries of extrinsic base regions 425, is determined by control of deposition thickness of the conformal silicon oxide layer prior to etch back.

Since the boundaries of extrinsic base regions 425 are controlled by deposition thickness of the conformal silicon oxide layer and etch back, rather than alignment of photomasks, the span of each link base region 423 does not need to be increased to account for any misalignment between separate photomasks. Therefore, the span of each link base region 423 can be substantially minimized as discussed above. Thus, link base resistance, which depends on the length of link base region 423, is accurately controlled, predicted, and also substantially reduced. The width of link spacers 436 and, as a result, the width of link base regions 423 is proportional to the deposition thickness of the conformal silicon oxide. The typical error in control of deposition thickness of the silicon oxide conformal layer is on the order of approximately 100 to 200 Angstroms. In contrast, the typical error in alignment of separate photomasks is on the order of approximately 1000 Angstroms at best. Thus for one embodiment of the invention described here, the width control of link base region 423 can be improved by a factor of approximately 5 to 10. Improved width control requires a smaller "safety" distance to account for error, thereby allowing a decrease in the length of link base region 423. Therefore, the resistance of link base region 423, which depends on the length of link base 423, is reduced. The lower resistance improves the overall base resistance of the HBT by lowering the contribution of link base regions 423 to the series resistance of the path from the base contacts, through the extrinsic base regions 425, and link base regions 423 to intrinsic base region 427.

After link spacers 436 are formed, extrinsic base regions 425 are doped by ion implantation to reduce the resistance of extrinsic base regions 425. The ion implantation doping uses temporary emitter 430 and link spacers 436 as a mask. It is noted that doping of exposed extrinsic base regions 425 is, thus, self-aligned; that is, the doping of exposed extrinsic base regions 425 is defined by the edge of link spacers 436, and does not depend on the alignment of a photomask. Ion implantation of extrinsic base regions 425 has resulted in the heavily doped P+ implanted regions 426 within extrinsic base regions 425. In one embodiment, the dopant used to form implanted regions 426 can be boron. The heavy doping in implanted regions 426 lowers the overall resistance of extrinsic base regions 425. The overall base resistance is thereby improved by lowering the contribution of extrinsic base regions 425 to the series resistance of the path from the base contacts, through the heavily doped extrinsic base regions 425, and link base regions 423 to intrinsic base region 427.

Referring now to FIG. 5, the cross sectional view in FIG. 3 is shown after further steps in the process used to form an NPN HBT in accordance with an alternative embodiment. FIG. 5 corresponds to the same step in the sequence of processing as FIG. 4. In other words, FIG. 5 may be thought of as an alternative view to FIG. 4 which occurs at the same point in time as FIG. 4. Thus, structure 560 of FIG. 5 shows various features and components of structure 360 of FIG. 3. Features and components of structure 560 corresponding to those of structure 360 are numbered in a manner consistent with FIG. 3. In particular, base 320, link base regions 323, extrinsic base regions 325, intrinsic base region 327, temporary emitter 330, temporary emitter polycrystalline silicon 331, ARC 332, and emitter width 334 are shown, respectively, as base 520, link base regions 523, extrinsic base regions 525, intrinsic base region 527, temporary emitter 530, temporary emitter polycrystalline silicon 531, ARC 532, and emitter width 534. Note that a portion of etch stop layer 328 still remains as etch stop layer 528 comprising part of temporary emitter 530. Etch stop layer 528 may be comprised, for example, of silicon oxide. Also, ARC 532 still remains comprising part of temporary emitter 530.

As described above in relation to FIG. 3, link base regions 523 may be lightly doped by ion implantation to reduce or control the resistance of link base regions 323. Ion implantation of link base regions 523 results in the lightly doped P+implanted regions 524 within link base regions 523. For example, the dopant used to form implanted regions 524 can be boron. The lightly doped implanted regions 524 lower the overall resistance of link base regions 523. The overall base resistance is thereby improved by lowering the contribution of link base regions 523 to the series resistance of the path from the base contacts, through the heavily doped extrinsic base regions 525, and link base regions 523 to intrinsic base region 527. It is noted that implant doping of link base regions 523 is self-aligned, as stated above. Thus, FIG. 5 shows an alternative embodiment in which link base regions 523 as well as extrinsic base regions 525 have both been implanted to control base resistance.

By way of comparison, FIG. 4 shows an embodiment in which link base regions 423 have not been implanted, but extrinsic base regions 425 have been implanted. Returning to FIG. 5, since one implant occurs before the formation of link spacers 536 and the other implant occurs after the formation of link spacers 536, independent control is achieved over the doping of implanted regions 524 with respect to control over the doping of heavily doped P+ implanted regions 526. Therefore, the invention provides a means to independently control the resistance of the link base regions 523 and extrinsic base regions 525.

Figure 6:
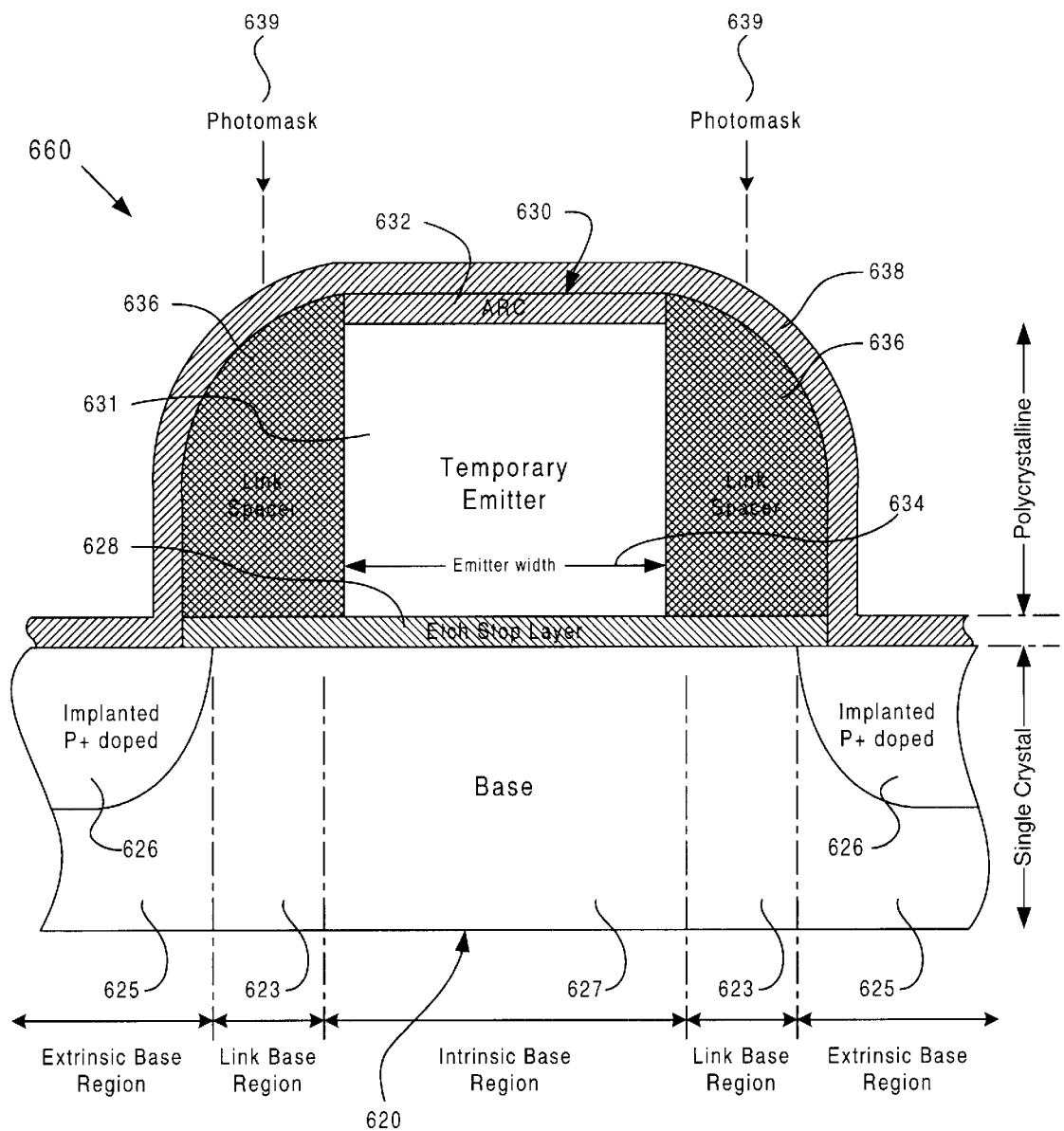
FIG. 6 illustrates the cross sectional view in FIG. 4, at a later time, of some of the features of an NPN HBT fabricated in accordance with one embodiment of the present invention.

Referring now to FIG. 6, the cross sectional view in FIG. 4 is shown after further steps in the process used to form an NPN HBT in accordance with one embodiment. Structure 660 of FIG. 6 shows various features and components of structure 460 of FIG. 4. Features and components of structure 660 corresponding to those of structure 460 are numbered in a manner consistent with FIG. 4. In particular, base 420, link base regions 423, extrinsic base regions 425, implanted regions 426, intrinsic base region 427, etch stop layer 428, temporary emitter 430, temporary emitter polycrystalline silicon 431, ARC 432, emitter width 434, and link spacers 436 are shown, respectively, as base 620, link base regions 623, extrinsic base regions 625, implanted regions 626, intrinsic base region 627, etch stop layer 628, temporary emitter 630, temporary emitter polycrystalline silicon 631, ARC 632, emitter width 634, and link spacers 636.

After formation of link spacers 436 and implant doping of implanted regions 426 shown in FIG. 4, a protective layer is deposited over the entire structure 460. For example the protective layer can be comprised of silicon oxide. FIG. 6 shows the protective layer as silicon oxide layer 638, covering structure 660. After silicon oxide layer 638 is deposited, a photoresist mask, or photomask, is opened above temporary emitter 630. This photomask is called "photomask" in FIG. 6, and is referred to by numeral 639. As indicated in FIG. 6, the edges of the opening in photomask 639 are aligned to fall approximately over the center of link spacers 636. With current techniques the accuracy of alignment, or alignment tolerance, of photomasks is approximately 0.08 micron. The spacers are formed to have a width in the range of approximately 0.15 micron to approximately 0.20 micron. Thus, in the worst case of misalignment, the edges of the opening in photomask 639 will still align over spacers 636.

Continuing with FIG. 6, the next step in the process of fabricating an NPN HBT in accordance with one embodiment of the present invention is to remove silicon oxide layer 638 (and ARC 632, if it has been left there) from the opening in photomask 639. For example, silicon oxide layer 638 can be removed using a reactive ion etch stopping on temporary emitter polycrystalline silicon 631. The next step is to etch away temporary emitter polycrystalline silicon 631 with an etch that stops on etch stop layer 628. For example, etch stop layer 628 can be comprised of silicon oxide, and a chlorine based etch that stops on silicon oxide can be used. The next step is to remove the center portion of etch stop layer 628 that comprises a portion of temporary emitter 630. For example, if etch stop layer 628 is comprised of silicon oxide, the center portion of etch stop layer 628 can be removed with a wet strip such as an HF (hydrogen fluoride) dip. An HF dip will also smooth out the top of spacers 636, which have been roughened by the previous etching processes used to remove silicon oxide layer 638, ARC 632, and temporary emitter polycrystalline silicon 631. Finally, the photoresist used to form photomask 639 is stripped from structure 660. Thus, the removal of temporary emitter 630, comprising ARC 632, temporary emitter polycrystalline silicon 631, and the center portion of etch stop layer 628 forms a cavity directly above intrinsic base region 627 of silicon-germanium base 620. As shown in FIG. 6, the width of the cavity is determined by the width of temporary emitter 630, i.e. emitter width 634.

Figure 7:
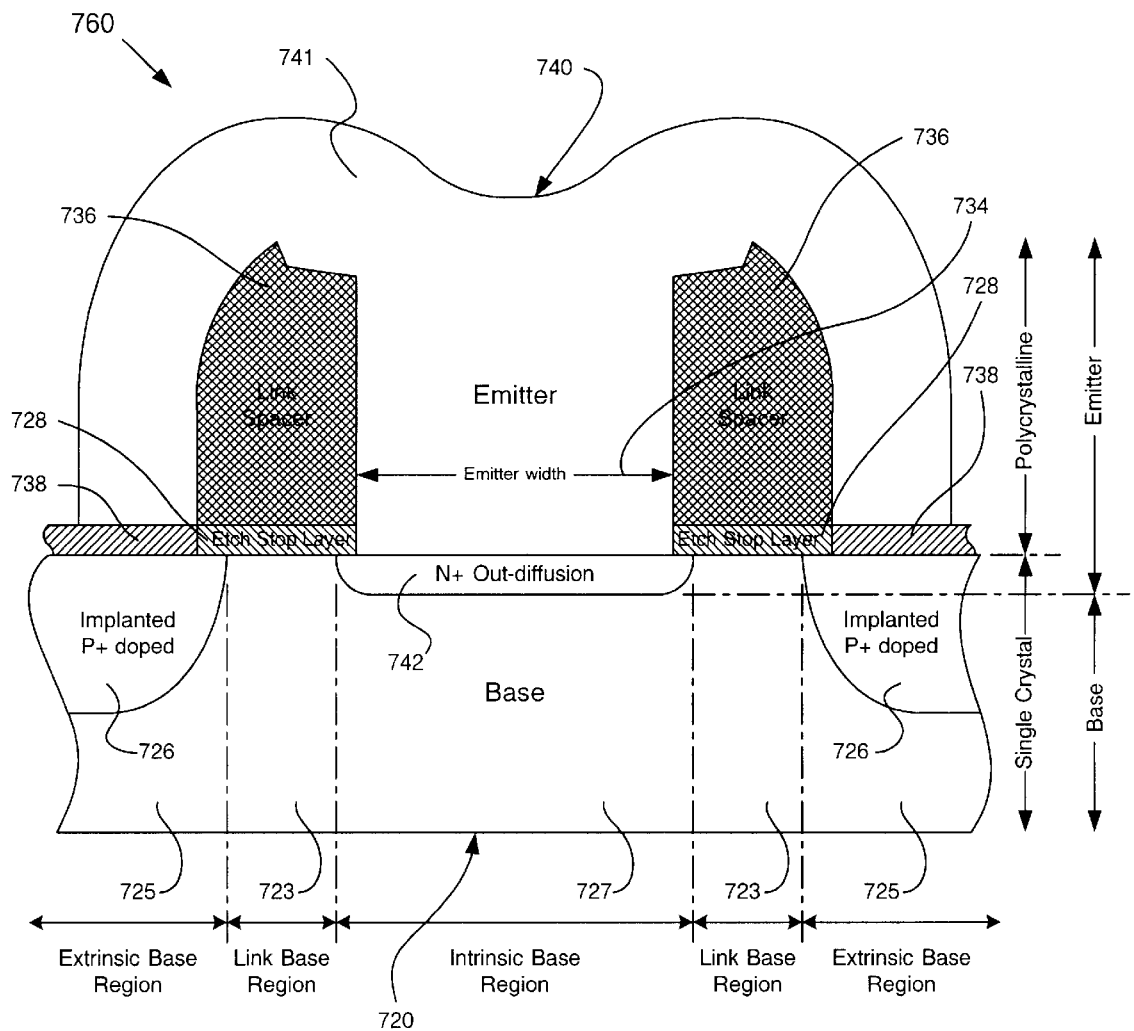
FIG. 7 illustrates the cross sectional view in FIG. 6, at a later time, of some of the features of an NPN HBT fabricated in accordance with one embodiment of the present invention.

Referring now to FIG. 7, the cross sectional view in FIG. 6 is shown after further steps in the process used to form an NPN HBT in accordance with one embodiment. Structure 760 of FIG. 7 shows various features and components of structure 660 of FIG. 6. Features and components of structure 760 corresponding to those of structure 660 are numbered in a manner consistent with FIG. 6. In particular, base 620, link base regions 623, extrinsic base regions 625, implanted regions 626, intrinsic base region 627, emitter width 634, link spacers 636, and silicon oxide layer 638 are shown, respectively, as base 720, link base regions 723, extrinsic base regions 725, implanted regions 726, intrinsic base region 727, emitter width 734, link spacers 736, and silicon oxide layer 738. Note that portions of etch stop layer 628 still remain as etch stop layer portions 728 comprising part of link spacers 736.

Continuing with FIG. 7, the next step in the process of fabricating an NPN HBT in accordance with one embodiment of the present invention is to deposit polycrystalline silicon in the cavity left by the removal of temporary emitter 630 to form final emitter 740 shown in structure 760 in FIG. 7. As FIG. 7 shows, emitter 740 comprises emitter polycrystalline silicon 741 and "out-diffusion region" 742 formed by the out-diffusion of N+ dopants from the emitter polycrystalline silicon 741 into the single crystal layer therebelow. As seen in FIG. 7, emitter polycrystalline silicon 741 is situated above N+ out-diffusion region 742.

Also as seen in FIG. 7, emitter polycrystalline silicon 741 substantially encapsulates link spacers 736. Link spacers 736 are situated above single crystal link base regions 723. In one embodiment, link spacers 736 can be silicon oxide. Single crystal N+ out-diffusion region 742 is situated above single crystal intrinsic base region 727. Extrinsic base regions 725, link base regions 723, and intrinsic base region 727 comprise base 720. The base-emitter junction is formed within the single crystal layer at the boundary of N+ out-diffusion region 742 and intrinsic base region 727.

Continuing with FIG. 7, N+ out-diffusion region 742 in the single crystal layer can be formed by out-diffusion of heavy concentration of arsenic dopants after ion implantation doping of emitter polycrystalline silicon 741. The N+ doping renders emitter 740 an N-type emitter. As stated above, ion implantation of extrinsic base regions 725 has resulted in the heavily doped P+ implanted regions 726 within extrinsic base regions 725. In one embodiment, the dopant used to form implanted regions 726 can be boron. The heavy doping in implanted regions 726 lowers the overall resistance of extrinsic base regions 725. The overall base resistance is thereby improved by lowering the contribution of extrinsic base regions 725 to the series resistance of the path from the base contacts, through the heavily doped extrinsic base regions 725, and link base regions 723 to intrinsic base region 727.

The final width of final emitter 740 is final emitter width 734, which is the width of the cavity left by the removal of temporary emitter 630, which is the width of temporary emitter 630. As stated above, the processes used to form temporary emitter 630 are analogous to those used to form an MOS or CMOS gate, and those same processes can be used to accurately control the width of temporary emitter 630. Therefore, the processes and methods used to control MOS and CMOS feature size can be used with one embodiment of the present invention to control final emitter width 734, i.e. the final width of final emitter 740. Thus, the method of fabrication for bipolar devices provided by one embodiment of the present invention is scalable, that is, as technology progresses in reducing feature size for MOS and CMOS devices, the feature size of bipolar devices fabricated in accordance with one embodiment of the present invention can be reduced, or scaled, to match the feature size of those MOS and CMOS devices.

Furthermore, final emitter 740 is self-aligned by spacers 736 to extrinsic base regions 725. As long as the alignment of photomask 639 falls over spacers 736, which is within the capabilities and tolerances of current techniques, final emitter 740 is formed correctly self-aligned to link base regions 723 and extrinsic base regions 725 of base 720. Subsequent steps of patterning final emitter 740, and forming contacts, etc., can be performed as known in the art.

It is appreciated by the above detailed description that the invention provides a method for fabricating a self-aligned emitter in a bipolar transistor. The method eliminates problems associated with alignment of separate photomasks by using processes which do not depend on the alignment of photomasks to form the link base regions, the intrinsic base regions, the base-emitter junction, and to implant the heavily doped extrinsic base regions. Using the invention, an emitter can be formed in an HBT, in which emitter width is accurately controlled, and which is substantially as small as photolithographic techniques allow. Further, using the invention, base resistance in an HBT can be controlled and improved. Although the invention is described as applied to the construction of a heterojunction bipolar transistor, it will be readily apparent to a person of ordinary skill in the art how to apply the invention in similar situations where reduced feature size and self-aligned implant are needed.

From the above description of the invention it is manifest that various techniques can be used for implementing the concepts of the present invention without departing from its scope. For example, although the particular embodiment of the present invention described here is applied to silicon-germanium bipolar HBT device, the invention is also applicable, for example, to silicon or silicon-germanium bipolar or BiCMOS devices. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a method for fabricating a self-aligned emitter in a bipolar transistor has been described.

What is claimed is:

1. A method comprising steps of:

forming a base, said base including an extrinsic base region, a link base region, and an intrinsic base region;

depositing an etch stop layer over said base;

patterning a temporary layer of material on said base so as to form a temporary emitter on said etch stop layer;

fabricating first and second link spacers on, respectively, first and second sides of said temporary emitter;

depositing a silicon oxide protective layer over said extrinsic base, said first and second link spacers, and said temporary emitter;

etching away said temporary emitter and said etch stop layer so as to form a cavity between said first and second link spacers;

forming a final emitter in said cavity on said intrinsic base region.

2. The method of claim 1 further comprising a step of implant doping said link base region after said patterning step and before said step of fabricating said first and second link spacers.

3. The method of claim 1 further comprising a step of implant doping said extrinsic base region subsequent to said step of fabricating said first and second link spacers and prior to said step of etching away said temporary emitter.

4. The method of claim 1 wherein said base comprises silicon-germanium.

5. The method of claim 1 wherein said base comprises silicon.

6. The method of claim 1 wherein said temporary layer of material comprises polycrystalline silicon.

7. The method of claim 1 wherein said temporary emitter comprises polycrystalline silicon.

8. The method of claim 1 wherein said etch stop layer comprises silicon oxide.

9. The method of claim 1 wherein said final emitter comprises polycrystalline silicon.

10. The method of claim 1 wherein said first and second link spacers comprise silicon oxide.

11. The method of claim 1 wherein a base-emitter junction is formed within said intrinsic base region.

12. The method of claim 1 wherein a final width of said final emitter is determined by a width of said temporary emitter.

13. The method of claim 1 further comprising a step of opening a photoresist mask to pattern said temporary emitter and said first and second link spacers after said step of depositing said silicon oxide protective layer and before said step of etching away said temporary emitter.

14. A method comprising steps of:

forming a base, said base including an extrinsic base region, a link base region, and an intrinsic base region;

depositing an etch stop layer over said base;

patterning a temporary layer of material on said base so as to form a temporary emitter on said etch stop layer;

depositing a conformal layer of a dielectric over said temporary emitter;

etching back said conformal layer of said dielectric so as to form first and second link spacers on, respectively, first and second sides of said temporary emitter;

depositing a silicon oxide protective layer over said extrinsic base, said first and second link spacers, and said temporary emitter;

etching away said temporary emitter and said etch stop layer so as to form a cavity between said first and second link spacers;

forming a final emitter in said cavity on said intrinsic base region.

15. The method of claim 14 wherein said conformal layer of said dielectric comprises silicon oxide.

16. The method of claim 15 wherein a length of said link base region is determined by a deposition thickness of said conformal layer.

17. The method of claim 14 wherein a length of said link base region is determined by a deposition thickness of said conformal layer.

18. A method comprising steps of:

forming a silicon-germanium base, said silicon-germanium base including an extrinsic base region, a link base region, and an intrinsic base region;

depositing an etch stop layer over said silicon-germanium base;

patterning a layer of polycrystalline silicon on said silicon-germanium base so as to form a temporary emitter on said etch stop layer;

depositing a conformal layer of a dielectric over said temporary emitter;

etching back said conformal layer of said dielectric so as to form first and second link spacers on, respectively, first and second sides of said temporary emitter;

depositing a silicon oxide protective layer over said extrinsic base, said first and second link spacers, and said temporary emitter;

etching away said temporary emitter and said etch stop layer so as to form a cavity between said first and second link spacers;

forming a final emitter in said cavity on said intrinsic base region.

19. The method of claim 18 further comprising a step of implant doping said link base region after said patterning step and before said step of etching back.

20. The method of claim 18 further comprising a step of implant doping said extrinsic base region subsequent to said step of etching back and prior to said step of etching away said temporary emitter.

21. The method of claim 18 wherein said etch stop layer comprises silicon oxide.

22. The method of claim 18 wherein said final emitter comprises polycrystalline silicon.

23. The method of claim 18 wherein said first and second link spacers comprise silicon oxide.

24. The method of claim 18 wherein said conformal layer of said dielectric comprises silicon oxide.

25. The method of claim 24 wherein a length of said link base region is determined by a deposition thickness of said conformal layer.

26. The method of claim 18 wherein a base-emitter junction is formed within said intrinsic base region.

27. The method of claim 18 wherein a final width of said final emitter is determined by a width of said temporary emitter.

28. The method of claim 18 wherein a length of said link base region is determined by a deposition thickness of said conformal layer.

29. The method of claim 18 further comprising a step of opening a photoresist mask to pattern said temporary emitter and said first and second link spacers after said step of depositing said silicon oxide protective layer and before said step of etching away said temporary emitter.

30. A method comprising steps of:

depositing an etch stop layer over a base;

patterning a temporary layer of material on said base so as to form a temporary emitter on said etch stop layer;

fabricating first and second link spacers on, respectively, first and second sides of said temporary emitter;

implant doping said base;

depositing a silicon oxide protective layer over said base, said first and second link spacers, and said temporary emitter;

etching away said temporary emitter and said etch stop layer so as to form a cavity between said first and second link spacers;

forming a final emitter in said cavity.

31. The method of claim 30 further comprising a step of implant doping said base after said patterning step and before said step of fabricating said first and second link spacers.

32. The method of claim 30 wherein said fabricating step comprises:

depositing a conformal layer of a dielectric over said temporary emitter;

etching back said conformal layer of said dielectric so as to form said first and second link spacers on, respectively, said first and second sides of said temporary emitter.

33. The method of claim 32 wherein a length of a link base region is determined by a deposition thickness of said conformal layer.

34. The method of claim 30 wherein a final width of said final emitter is determined by a width of said temporary emitter.

35. The method of claim 30 wherein a base-emitter junction is formed within said base.

36. The method of claim 30 wherein said temporary layer of material comprises polycrystalline silicon.

37. The method of claim 30 wherein said final emitter comprises polycrystalline silicon.

38. The method of claim 30 wherein said first and second link spacers comprise silicon oxide.

39. The method of claim 30 wherein said base comprises silicon-germanium.

40. The method of claim 30 wherein said etch stop layer comprises silicon oxide.

41. The method of claim 30 further comprising a step of opening a photoresist mask above said temporary emitter after said step of depositing said silicon oxide protective layer and before said step of etching away said temporary emitter.

* * * * *